(12) United States Patent
Lee et al.

(10) Patent No.: US 7,615,338 B2
(45) Date of Patent: Nov. 10, 2009

(54) PHOTORESIST COATING COMPOSITION AND METHOD FOR FORMING FINE PATTERN USING THE SAME

(75) Inventors: Geun Su Lee, Yongin-si (KR); Seung Chan Moon, Yongin-si (KR); Seung Hun Lee, Daegugwangyeok-si (KR)

(73) Assignees: Hynix Semiconductor Inc., Icheon-shi (KR); Youngchang Chemical Co., Ltd., Daegugwangyeok-si (KR)

( * ) Notice: Subject to any disclaimer, the term of this patent is extended or adjusted under 35 U.S.C. 154(b) by 307 days.

(21) Appl. No.: 11/298,385

(22) Filed: Dec. 8, 2005

(65) Prior Publication Data
US 2006/0263717 A1    Nov. 23, 2006

(30) Foreign Application Priority Data
May 19, 2005    (KR) ............... 10-2005-0041957

(51) Int. Cl.
*G03C 1/73* (2006.01)
*G03F 7/26* (2006.01)
*G03F 7/36* (2006.01)

(52) U.S. Cl. ............. 430/322; 430/270.1; 430/330
(58) Field of Classification Search ........ 430/270.1, 430/331, 330
See application file for complete search history.

(56) References Cited

U.S. PATENT DOCUMENTS

| | | | | |
|---|---|---|---|---|
| 4,699,824 A | * | 10/1987 | Pufahl | 428/220 |
| 5,223,376 A | * | 6/1993 | Hasegawa et al. | 430/326 |
| 6,046,114 A | * | 4/2000 | Tohda | 438/695 |
| 6,514,656 B1 | * | 2/2003 | Nakamura et al. | 430/157 |
| 6,551,757 B1 | * | 4/2003 | Bailey et al. | 430/270.1 |
| 6,579,657 B1 | * | 6/2003 | Ishibashi et al. | 430/270.1 |
| 6,800,415 B2 | * | 10/2004 | Lu et al. | 430/270.1 |
| 6,824,951 B2 | | 11/2004 | Lee et al. | 430/270.1 |
| 2002/0082375 A1 | * | 6/2002 | Andrist et al. | 526/317.1 |
| 2002/0197559 A1 | * | 12/2002 | Nishi et al. | 430/270.1 |
| 2003/0044542 A1 | * | 3/2003 | Ito | 427/421 |
| 2003/0150739 A1 | * | 8/2003 | Morozov et al. | 205/133 |
| 2006/0046446 A1 | * | 3/2006 | Kon et al. | 438/579 |
| 2006/0127351 A1 | * | 6/2006 | Doherty et al. | 424/78.27 |

FOREIGN PATENT DOCUMENTS

| | | |
|---|---|---|
| JP | 62299960 | 12/1987 |
| JP | S62-299836 | 12/1987 |
| WO | WO03/061635 | * 7/2003 |

OTHER PUBLICATIONS

"Resists Join the Sub-λ Revolution", Laura J. Peters, Semiconductor International, (http://www.semipark...) Sep. 1999, 7 pages.
Korean Intellectual Property Office Notice of Rejection, for Korean Patent Application No. 10-2005-0041957, dated Nov. 21, 2006.

* cited by examiner

*Primary Examiner*—Cynthia H Kelly
*Assistant Examiner*—Anca Eoff
(74) *Attorney, Agent, or Firm*—Marshall, Gerstein & Borun LLP

(57) ABSTRACT

A photoresist coating composition that includes a compound represented by Formula 1 and an aqueous solvent, and a method for forming a fine pattern by coating the composition on a photoresist pattern to effectively reduce a size of a photoresist contact hole and a space, which can be applied to all semiconductor processes.

21 Claims, 6 Drawing Sheets

PHOTORESIST COATING COMPOSITION AND METHOD FOR FORMING FINE PATTERN USING THE SAME

BACKGROUND OF THE DISCLOSURE

1. Field of the Disclosure

This disclosure relates generally to a photoresist coating composition and a method for forming a fine pattern using the same. More specifically, the disclosure relates to a photoresist coating composition containing a water-soluble polymer and an aqueous solvent, and a method for forming a fine pattern by reducing the size of a space or contact hole of the photoresist pattern using the same.

2. Description of the Related Technology

As the manufacturing technology of semiconductor devices has developed and the fields of application of memory devices have been extended, the development of lithography processes, (i.e., the development of photoresist materials, new exposure light sources, and light exposer technology) has accelerated in order to develop memory devices with improved integration. However, since the resolution with commonly-used KrF and ArF light exposers is limited within 0.1 µm, it is difficult to form a fine pattern for manufacturing an integrated semiconductor device.

In order to form a conventional fine pattern, resist flow processes (hereinafter, referred to as "RFP")(see U.S. Pat. No. 6,824,951) or a process using materials such as RELACS (resist enhancement lithography assisted by chemical shrink) (See "Resists Join the Sub-λ Revolution", Semiconductor International, 1999. 9., Laura J. Peters), and SAFIER (shrink assist film for enhanced resolution) produced by TOK Company have been generally introduced.

In RFP, a photoresist pattern is formed by using an exposure process and a developing process, and then thermal energy is applied at above a glass transition temperature of the photoresist, so that the photoresist may flow thermally. The previously formed pattern has been gradually reduced by the supplied heat energy. As a result, a fine pattern is formed to have a small size required in an integrated process.

Referring to FIG. 1, an exposure process and a developing process are performed on a substrate 1 having an underlying layer 3, thereby obtaining a photoresist pattern 5. Then, thermal energy 7 is applied to the resulting structure at a temperature above a glass transition temperature of the photoresist for a predetermined time, which results in an inward thermal flow 9 of the photoresist to reduce the size of a contact hole or pattern.

Even when thermal energy is transmitted uniformly to the whole surface of photoresist in the RFP at a temperature above the glass transition temperature, the amount of photoresist flow is relatively larger in the lower portion than in the upper or middle portions. As a result, an overflowing phenomenon occurs such that the upper portion of the pattern becomes wider than the lower portion.

Since most of the photoresist reacts sensitively with the applied heat, the overflowing phenomenon most frequently occurs when temperature regulation is poor and the flowing time becomes longer than a predetermined value.

In order to reduce the overflowing phenomenon, temperatures of bake ovens for applying heat have been equalized or the baking time has been precisely regulated. However, although the above baking process is improved, the overflowing phenomenon is not reduced or eliminated.

According to the RELACS process, as shown in FIG. 2, an exposure process and a developing process are performed on a substrate 11 having an underlying layer 13, thereby obtaining a photoresist pattern 15. A RELACS material 17 is coated on the whole surface of photoresist, and then a developing process is performed on the resultant structure, by which a thermal process is performed on the resulting structure. As a result, a cross-linking reaction 19 is formed between the RELACS material 17 and the photoresist pattern 15 to reduce the size of a contact hole or a pattern.

According to the method using the SAFIER material, as shown in FIG. 3, an exposure process and a developing process are performed on a substrate 21 having an underlying layer 23, thereby obtaining a photoresist pattern 25. Then, a SAFIER material 27 is coated on the whole surface of the photoresist, and a thermal process is performed on the resulting structure. As a result, the photoresist material is shrunk to reduce a size of a contact hole or a pattern 29.

Although the processes employing the RELACS material or the SAFIER material can reduce the size of the pattern regardless of a duty ratio, they are more costly and residuals remain in the pattern due to the incomplete removal of the water-soluble polymer, which adversely affects subsequent etching processes. As a result, defects are generated in the final devices, which degrades yield and reliability of the devices.

Moreover, since the above-described methods further include a coating process, a thermal process, a developing process, and a wafer cleaning process of two steps, the procedure is more complicated, and the process cost increases accordingly.

SUMMARY OF THE DISCLOSURE

The disclosure provides a method for forming a fine pattern which may overcome the above-described problems without use of expensive materials or a more complicated process.

Disclosed herein is photoresist coating composition comprising a water-soluble polymer and an aqueous solvent which reacts with a photoresist material to form a coating film on its surface.

Also, disclosed herein is a method for forming a fine pattern using the same.

BRIEF DESCRIPTION OF THE DRAWINGS

For a more complete understanding of the invention, reference should be made to the following detailed description and accompanying drawings wherein.

Figure 1:
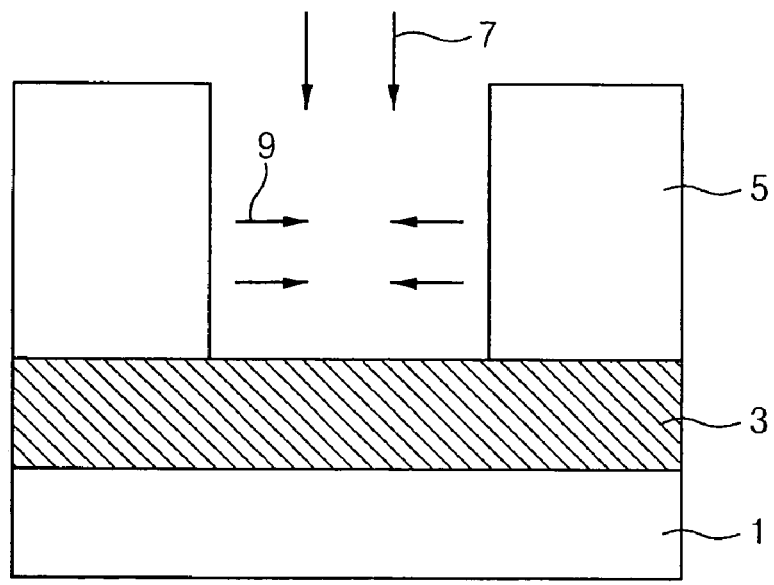
FIG. 1 is a cross-sectional diagram illustrating a method for forming a fine pattern according to a conventional RFP method.
Figure 1:
Figure 1:
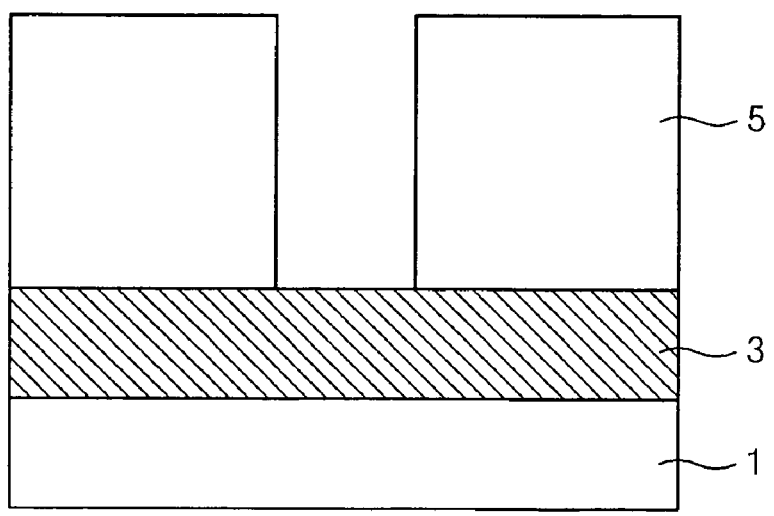
Figure 2:
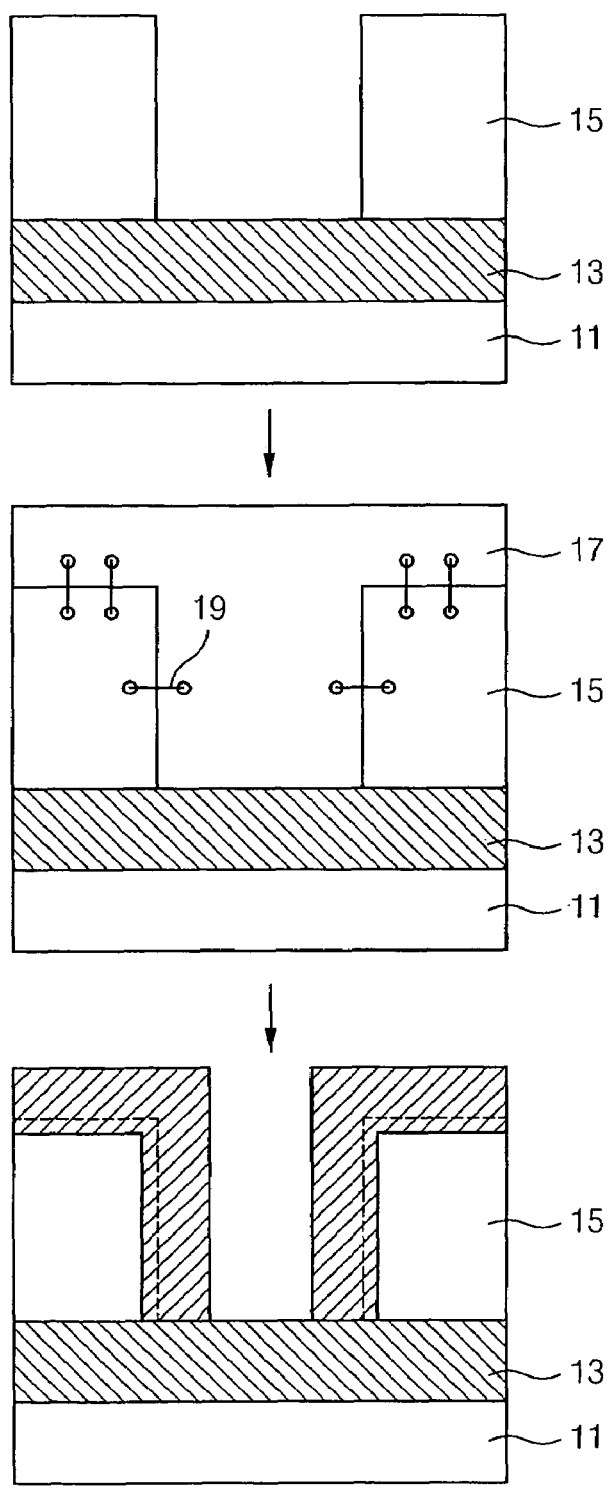
FIG. 2 is a cross-sectional diagram illustrating a method for forming a fine pattern using a conventional RELACS material.
Figure 3:
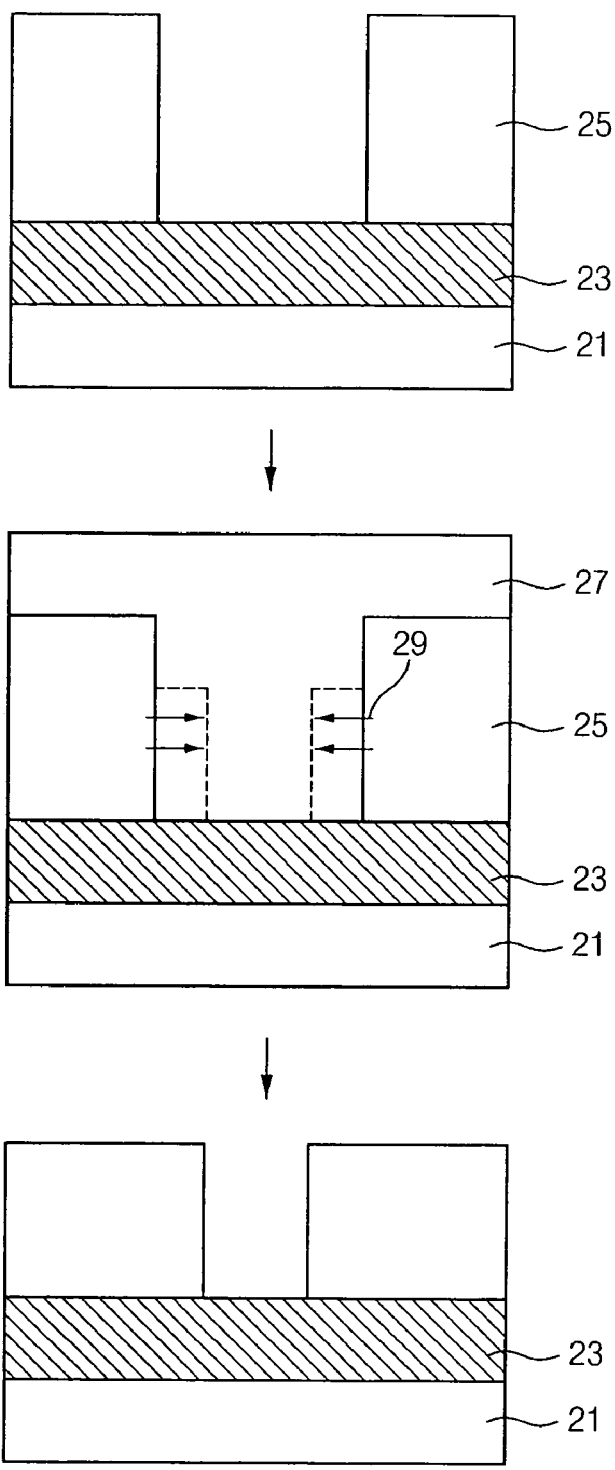
FIG. 3 is a cross-sectional diagram illustrating a method for forming a fine pattern using a conventional SAFIER material.

The specification, drawings and examples are intended to be illustrative, and are not intended to limit this disclosure to the specific embodiments described herein.

DETAILED DESCRIPTION OF PREFERRED EMBODIMENTS

According to the disclosure, a photoresist coating composition contains a water-soluble polymer with a repeating unit represented by the Formula 1 and the balance of an aqueous solvent:

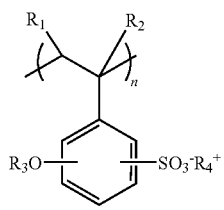

[Formula 1]

wherein $R_1$ and $R_2$ are individually selected from the group consisting of H, linear and branched $C_1$-$C_{20}$ alkyl groups, halogen, and —CN groups;

$R_3$ is selected from the group consisting of H, linear and branched $C_1$-$C_{20}$ alkyl groups and $C_7$-$C_{20}$ alkylaryl groups;

$R_4$ is selected from the group consisting of Na, $NH(R_5)_3$ and $N(R_6)_4$ wherein $R_5$ and $R_6$ are individually selected from the group consisting of H, linear and branched $C_1$-$C_{20}$ alkyl groups and $C_7$-$C_{20}$ alkylaryl groups; and n is an integer ranging from 10 to 3000.

Here, n is not specifically limited to represent the effect of the polymer.

$R_3$, $R_5$, and $R_6$ are preferably individually selected from the group consisting of methyl, ethyl, propyl, butyl, octyl, octyl phenyl, nonyl, nonyl phenyl, decyl, decyl phenyl, undecyl, undecyl phenyl, dodecyl, and dodecyl phenyl.

The water-soluble polymer of Formula 1 is preferably selected from the group consisting of poly(anetholesulfonic acid, sodium salt), poly(anetholesulfonic acid, triethylamine salt) and poly(anetholesulfonic acid, ammonium salt), and combinations thereof.

The aqueous solvent is preferably $H_2O$, highly preferably distilled water.

The water-soluble polymer of Formula 1 is preferably present in an amount ranging from 0.001 to 5 parts by weight based on 100 parts by weight of the aqueous solvent. A coating film may not be formed on the surface of photoresist when the compound of Formula 1 is present in the amount of less than 0.001 parts by weight, and a contact hole may be plugged when the compound of Formula 1 is present in the amount of more than 5 parts by weight (based on 100 parts of the aqueous solvent).

To improve solubility and coating characteristics of the composition for coating a photoresist pattern, the disclosed composition may further include various additives. The additive is not specifically limited to improve solubility and coating characteristics of the composition. Preferably, the additive is (a) an alcohol compound or (b) a surfactant.

The alcohol compound is preferably selected from the group consisting of $C_1$-$C_{10}$ alkyl alcohols and $C_2$-$C_{10}$ alkoxy alkylalcohols. Preferably, the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol, and combinations thereof. The $C_2$-$C_{10}$ alkoxy alkylalcohol is preferably selected from the group consisting of 2-methoxyethanol, 2-(2-methoxy ethoxy)ethanol, 1-methoxy-2-propanol, 3-methoxy-1,2-propandiol, and combinations thereof.

The surfactant is not specifically limited to improve coating characteristics of the disclosed composition.

Preferably, the additive is present in an amount ranging from 1 to 10, preferably 1 to 3, parts by weight based on 100 parts by weight of the aqueous solvent. When the surfactant is included in the additive, the surfactant is preferably present in an amount ranging from 0.001 to 0.1 parts by weight based on the 100 parts by weight of the aqueous solvent.

The effect of the additive is relatively weak when the additive is present in an amount of less than 1 parts by weight, and the photoresist material may dissolve in the additive to deform the pattern when the additive is present in an amount of more than 10 parts by weight.

When the disclosed photoresist coating composition is coated on a previously formed photoresist pattern by a spin-coating method, a cross-linkage is formed between with the photoresist material and the disclosed coating composition to form a uniform coating film on the photoresist pattern, thereby reducing a space of the pattern or the size of a hole effectively.

The disclosed composition may have the following characteristics:

(1) does not damage an underlying layer pattern exposed while coating the disclosed composition;

(2) has excellent adhesion properties so as to form a thin film on an interface of the photoresist pattern and a lower interface of the exposed photoresist pattern when the disclosed composition is coated;

(3) has similar or higher etching resistance than a conventional photoresist material;

(4) does not generate foams on the surface of the photoresist pattern when the disclosed composition is coated; and (5) forms the profile of the photoresist pattern vertically at about 80° to about 100° after the disclosed composition is coated.

The disclosed composition can be obtained by filtering a mixture solution comprising the aqueous solvent and the compound of the Formula 1 or a solution further comprising the additive in the mixture solution in a 0.2 μm filter. The disclosed composition can be applied to all processes for forming a photoresist pattern.

In addition, there is provided a method for forming a photoresist pattern.

The method includes the steps of:

(a) coating a photoresist composition on an underlying layer of a semiconductor substrate;

(b) performing a soft-bake onto the resultant structure of step (a) to form a photoresist film;

(c) exposing the photoresist film of step (b) to light;

(d) performing a post-bake process on resulting structure of step (c);

(e) developing the resulting structure of step (d) to form a first photoresist pattern; and (f) coating the inventive coating composition on the first photoresist pattern to form a second photoresist pattern.

The size of the second photoresist pattern is preferably smaller than that of the first photoresist pattern.

The disclosed photoresist coating composition of step (f) is preferably sprayed to form a coating layer on a rotating wafer on which the first photoresist pattern is formed. The aqueous solvent is evaporated and removed and only the water-soluble polymer remains on the photoresist pattern to form a coating layer while the wafer is rotated.

Preferably, the second photoresist pattern has a size reduced by about at least 10% to about 30% compared to that of the first pattern.

Also, there is provided a semiconductor device manufactured by the above-described method using the disclosed coating composition.

The disclosed method for forming a pattern will be described in detail with reference to the attached drawings.

Figure 4A:
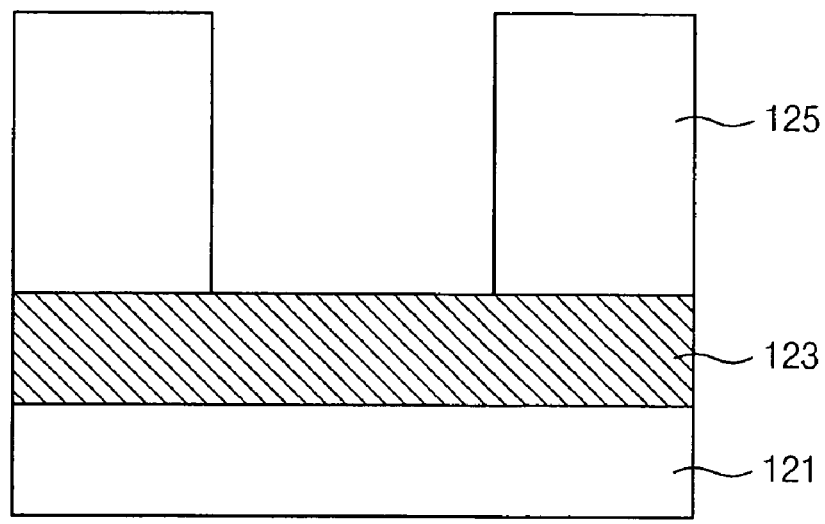
FIGS. 4a and 4b are cross-sectional diagrams illustrating a method for forming a fine pattern using a disclosed composition for coating a photoresist pattern.

As shown in FIG. 4a, an underlying layer 123 and a photoresist film (not shown) are sequentially formed on a semiconductor substrate 121. Then, an exposure and developing process is performed to form a first photoresist pattern 125.

Here, a soft baking process may be performed before the exposure process, and a post baking process may be performed after the exposure process. Each baking process is preferably performed at a temperature ranging from about 70° C. to about 200° C.

The light is preferably one of KrF (248 nm), ArF (193 nm), VUV (157 nm), EUV (13 nm), E-beam, X-ray, or ion-beam, and the exposure process is preferably performed at an exposure energy ranging from about 0.1 mJ/cm$^2$ to about 100 mJ/cm$^2$.

The developing process is preferably performed with an alkali developing solution which is preferably tetramethylammonium hydroxide (TMAH) aqueous solution of about 0.01 wt % to about 5 wt %.

Figure 4B:
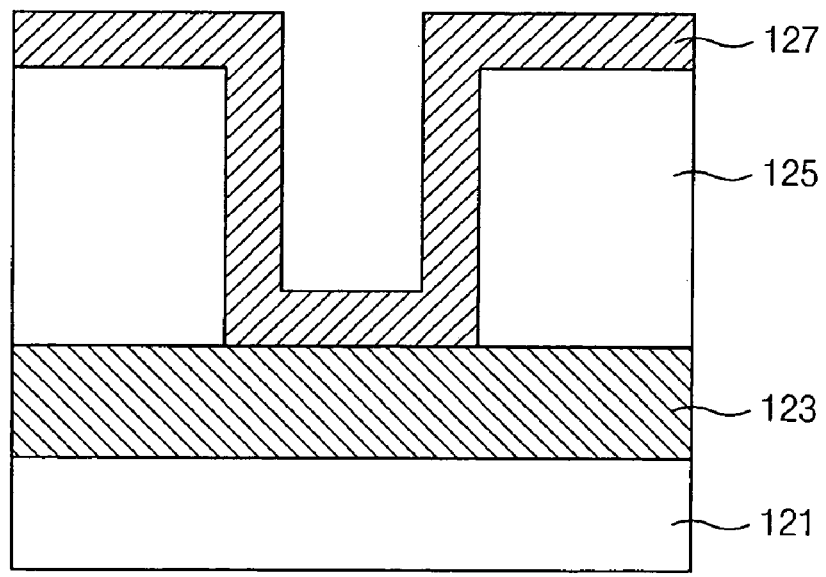

Thereafter, the disclosed coating composition is coated on the first photoresist pattern 125 of FIG. 4a by a spin-coating method to form a second photoresist pattern formed coating layer 127 as shown in FIG. 4b, thereby reducing a space of the pattern or the size of a contact hole. Preferably, the second photoresist pattern has a size reduced by about 10% to about 30% compared to that of the first pattern.

EXAMPLES

The disclosed compositions will be described in detail by referring to examples below, which are not intended to limit the present invention.

I. Preparation of a Disclosed Photoresist Coating Composition

Example 1

To distilled water (98.5 g) was added poly(anetholesulfonic acid, sodium salt) (1.5 g) having an average molecular weight of 200,000 (produced by Aldrich Co.). The resulting mixture was stirred at room temperature for one minute, and then filtered with a 0.2 µm filter to obtain a disclosed photoresist coating composition.

Example 2

To distilled water (95 g) were added poly(anetholesulfonic acid, ammonium salt) (1.5 g) having an average molecular weight of 30,000 (produced by Aldrich Co.) and n-butanol (3.5 g). The resulting mixture was stirred at room temperature for one minute, and then filtered with a 0.2 µm filter to obtain a disclosed photoresist coating composition.

Example 3

To distilled water (95 g) were added poly(anetholesulfonic acid, triethylamine salt) (1.5 g) having an average molecular weight of 35,000 (produced by Aldrich Co.) and 2-methoxy methanol (3.5 g). The resulting mixture was stirred at room temperature for one minute, and then filtered with a 0.2 µm filter to obtain a disclosed photoresist coating composition.

II. Formation of a Disclosed Fine Pattern

Comparative Example

Process for Forming a General Pattern

Figure 5:
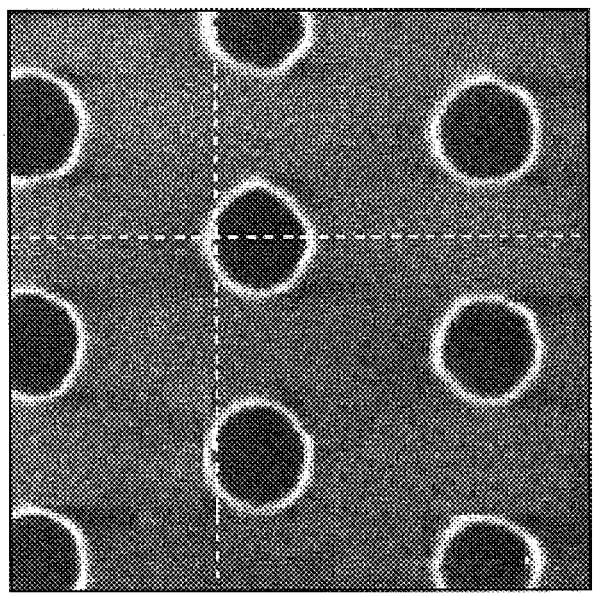
FIG. 5 is a photograph showing a photoresist pattern obtained in comparative Example.

An underlying layer was formed on a silicon wafer treated with HMDS (hexamethyldisilazone), and a methacrylate photoresist (TarF-7a-39 produced by TOK Co.) was spin-coated thereon to form a photoresist film at 2,400 Å. Then, the photoresist film was soft-baked at about 130° C. for about 90 seconds. After soft-baking, the photoresist film was exposed to light using an ArF laser exposer, and post-baked at about 130° C. for about 90 seconds. After post-baking, it was developed in 2.38 wt % tetramethylammonium hydroxide (TMAH) aqueous solution for about 30 seconds, to obtain a 110 nm contact hole pattern (see FIG. 5).

Example 4

Figure 6:
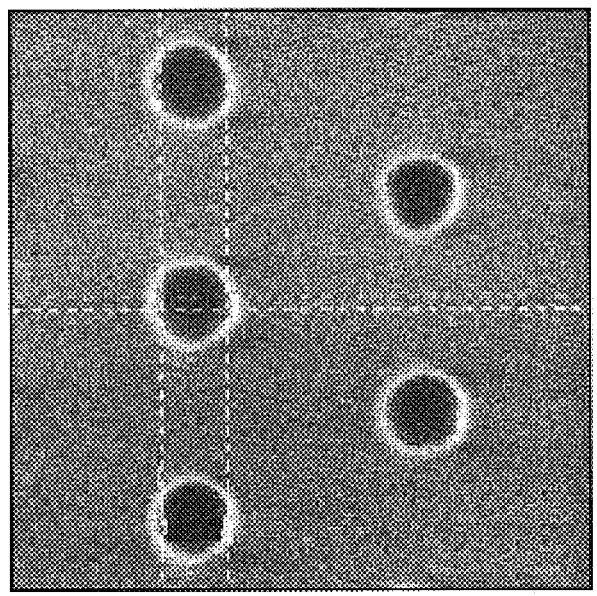
FIG. 6 is a photograph showing a photoresist pattern obtained in Example 4.

The composition obtained from Example 1 (10 mL) was spin-coated on the 110 nm contact hole pattern obtained from Comparative Example to obtain a 90 nm contact hole pattern (FIG. 6).

Example 5

Figure 7:
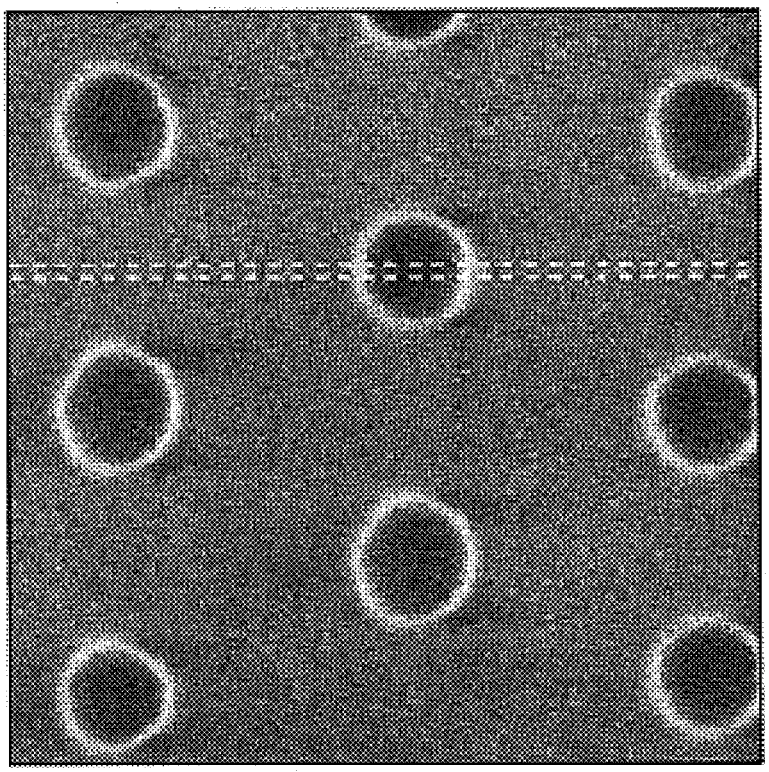
FIG. 7 is a photograph showing a photoresist pattern obtained in Example 5.

The composition obtained from Example 2 (10 mL) was spin-coated on the 110 nm contact hole pattern obtained from Comparative Example to obtain a 90 nm contact hole pattern (FIG. 7).

Example 6

The composition obtained from Example 3 (10 mL) was spin-coated on the 110 nm contact hole pattern obtained from Comparative Example to obtain a 90 nm contact hole pattern.

As described above, after photoresist pattern is formed, the disclosed photoresist coating composition is coated thereon to reduce a size of a hole or a space of the photoresist pattern effectively. As a result, the disclosed coating composition and the disclosed method can be usefully applied to all semiconductor processes for forming a fine pattern.

What is claimed is:

1. A method for forming a photoresist pattern, comprising:
   (a) coating a photoresist composition on an underlying layer of a semiconductor substrate;
   (b) performing a soft-bake onto the resultant structure of (a) to form a photoresist film;
   (c) exposing the photoresist film of (b) to light;
   (d) performing a post-bake onto the resulting structure of (c);
   (e) developing the resulting structure of (d) to form a first photoresist pattern; and
   (f) coating the coating composition on the first photoresist pattern to form a second photoresist pattern;
   wherein the coating composition consists of i) a water-soluble polymer having a repeating unit represented by the Formula 1, ii) an aqueous solvent and iii) an additive selected from the group consisting of a $C_1$-$C_{10}$ alkyl alcohols and a $C_2$-$C_{10}$ alkoxy alkyl alcohols:

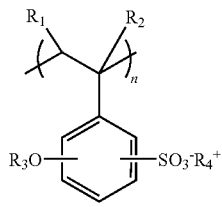

[Formula 1]

wherein $R_1$ and $R_2$ are individually selected from the group consisting of H, linear and branched $C_1$-$C_{20}$ alkyl groups, halogen, and —CN groups; $R_3$ is selected from the group consisting of methyl, ethyl, propyl, butyl, octyl, octyl phenyl, nonyl, nonyl phenyl, decyl, decyl phenyl, undecyl, undecyl phenyl, dodecyl and dodecyl phenyl; $R_4$ is selected from the group consisting of Na, $NH(R_5)_3$ and $N(R_6)_4$ wherein $R_5$ and $R_6$ are individually selected from the group consisting of methyl, ethyl, propyl, butyl, octyl, octyl phenyl, nonyl, nonyl phenyl, decyl, decyl phenyl, undecyl, undecyl phenyl, dodecyl, and dodecyl phenyl; and n is an integer ranging from 10 to 3000.

2. The method of claim 1, wherein the light source of (c) is selected from the group consisting of KrF (248 nm), ArF (193 nm), VUV (157 nm), EUV (13 nm), E-beam, X-ray, and ion beam.

3. The method of claim 1, comprising performing the coating process of (f) by spraying the coating composition on a rotating wafer on which the first photoresist pattern is formed.

4. The method of claim 1, wherein the size of the second photoresist pattern is smaller by 10% to 30% than that of the first photoresist pattern.

5. The method of claim 1, wherein the water-soluble polymer of Formula 1 is selected from the group consisting of poly(anetholesulfonic acid, sodium salt), poly(anetholesulfonic acid, triethylamine salt) and poly(anetholesulfonic acid, ammonium salt), and combinations thereof.

6. The method of claim 1, wherein the water-soluble polymer of Formula 1 is present in an amount ranging from 0.001 to 5 parts by weight based on 100 parts by weight of the aqueous solvent.

7. The method of claim 1, wherein the aqueous solvent is $H_2O$.

8. The method of claim 1, wherein the additive is a $C_1$-$C_{10}$ alkyl alcohol selected from the group consisting of methanol, ethanol, propanol, isopropanol, n-butanol, sec-butanol, t-butanol, 1-pentanol, 2-pentanol, 3-pentanol, 2,2-dimethyl-1-propanol, and combinations thereof.

9. The method of claim 1, wherein the additive is a $C_2$-$C_{10}$ alkoxy alkyl alcohol selected from the group consisting of 2-methoxyethanol, 2-(2-methoxyethoxy) ethanol, 1-methoxy-2-propanol, 3-methoxy-1,2-propandiol, and combinations thereof.

10. The method of claim 1, wherein the additive is present in an amount ranging from 1 to 10 parts by weight based on 100 parts by weight of the aqueous solvent.

11. The method of claim 10, wherein the additive is present in an amount ranging from 1 to 3 parts by weight based on 100 parts by weight of the aqueous solvent.

12. A method for forming a photoresist pattern, comprising:
(a) coating a photoresist composition on an underlying layer of a semiconductor substrate;
(b) performing a soft-bake onto the resultant structure of (a) to form a photoresist film;
(c) exposing the photoresist film of (b) to light;
(d) performing a post-bake onto the resulting structure of (c);
(e) developing the resulting structure of (d) to form a first photoresist pattern; and
(f) coating the coating composition on the first photoresist pattern to form a second photoresist pattern;
wherein the coating composition consists of (i) a water-soluble polymer selected from the group consisting of poly(anetholesulfonic acid, sodium salt), poly(anetholesulfon ic acid, triethylamine salt) and poly(anetholesulfonic acid, ammonium salt), and combinations thereof, (ii) an aqueous solvent and (iii) an additive selected from the group consisting of $C_1$-$C_{10}$ alkyl alcohols and $C_2$-$C_{10}$ alkoxy alkyl alcohols.

13. The method of claim 12, wherein the light source of (c) is selected from the group consisting of KrF (248 nm), ArF (193 nm), VUV (157 nm), EUV (13 nm), E-beam, X-ray, and ion beam.

14. The method of claim 12, comprising performing the coating process of (f) by spraying the coating composition on a rotating wafer on which the first photoresist pattern is formed.

15. The method of claim 12, wherein the size of the second photoresist pattern is smaller by 10% to 30% than that of the first photoresist pattern.

16. The method of claim 12, wherein the water-soluble polymer is present in an amount ranging from 0.001 to 5 parts by weight based on 100 parts by weight of the aqueous solvent.

17. The method of claim 12, wherein the aqueous solvent is $H_2O$.

18. The method of claim 12, wherein the additive is a $C_1$-$C_{10}$ alkyl alcohol selected from the group consisting of methanol, ethanol, propanol, isopropanol, n-butanol, sec-butanol, t-butanol, 1-pentanol, 2-pentanol, 3-pentanol, 2,2-d imethyl-1-propanol, and combination thereof.

19. The method of claim 12, wherein the additive is a $C_2$-$C_{10}$ alkoxy alkylalcohol selected from the group consisting of 2-methoxyethanol, 2-(2-methoxyethoxy) ethanol, 1-methoxy-2-propanol, 3-methoxy-1,2-propandiol and combination thereof.

20. The method of claim 12, wherein the additive is present in an amount ranging from 1to 10 parts by weight based on 100 parts by weight of the aqueous solvent.

21. The method of claim 20, wherein the additive is present in an amount ranging from 1 to 3 parts by weight based on 100 parts by weight of the aqueous solvent.

* * * * *